(12) United States Patent  (10) Patent No.: US 7,573,075 B2
Udagawa  (45) Date of Patent: Aug. 11, 2009

(54) COMPOUND SEMICONDUCTOR DEVICE, PRODUCTION METHOD OF COMPOUND SEMICONDUCTOR DEVICE AND DIODE

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 125 days.

(21) Appl. No.: 10/594,683

(22) PCT Filed: Mar. 28, 2005

(86) PCT No.: PCT/JP2005/006534

§ 371 (c)(1),
(2), (4) Date: Sep. 28, 2006

(87) PCT Pub. No.: WO2005/096355

PCT Pub. Date: Oct. 13, 2005

(65) Prior Publication Data

US 2007/0200114 A1  Aug. 30, 2007

Related U.S. Application Data

(60) Provisional application No. 60/560,268, filed on Apr. 8, 2004.

(30) Foreign Application Priority Data

Mar. 30, 2004  (JP)  ............................. 2004-098876

(51) Int. Cl.
*H01L 33/00* (2006.01)
*H01L 21/00* (2006.01)
(52) U.S. Cl. ................. 257/103; 257/76; 257/E33.001; 438/46

(58) Field of Classification Search ............. 257/76–79, 257/102, 103, E33.001–E33.049; 438/22, 438/46, 47
See application file for complete search history.

(56) References Cited

U.S. PATENT DOCUMENTS 5,005,057 A  4/1991  Izumiya et al.

(Continued)

FOREIGN PATENT DOCUMENTS

EP  1 109 208 A2  6/2001

(Continued)

OTHER PUBLICATIONS

T. L. Chu, et al, "Crystal and Epitaxial Layers of Boron Phosphide", Journal of Applied Physics, vol. 42, No. 1, Jan. 1991, pp. 420-424.

(Continued)

*Primary Examiner*—Evan Pert
*Assistant Examiner*—Kevin Quinto
(74) *Attorney, Agent, or Firm*—Sughrue Mion, PLLC

(57) ABSTRACT

A compound semiconductor device includes hexagonal silicon carbide crystal substrate and a boron-phosphide-based semiconductor layer formed on the silicon carbide crystal substrate, wherein the silicon carbide crystal substrate has a surface assuming a {0001} crystal plane, and the boron-phosphide-based semiconductor layer is composed of a {111} crystal stacked on and in parallel with the {0001} crystal plane of the silicon carbide crystal substrate, and when the number of the layers contained in one periodical unit of an atomic arrangement in the [0001] crystal orientation of the silicon carbide crystal substrate is n, an n-layer-stacked structure included in the {111} crystal plane forming the {111} crystal has a stacking height virtually equal to the c-axis lattice constant of the silicon carbide crystal substrate.

8 Claims, 2 Drawing Sheets

U.S. PATENT DOCUMENTS

| | | | |
|---|---|---|---|
| 5,042,043 A | 8/1991 | Hatano et al. | |
| 5,063,421 A | 11/1991 | Suzuki et al. | |
| 5,076,860 A | 12/1991 | Ohba et al. | |
| 5,228,044 A | 7/1993 | Ohba | |
| 5,387,804 A | 2/1995 | Suzuki et al. | |
| 5,766,783 A * | 6/1998 | Utsumi et al. | 428/698 |
| 2001/0012678 A1 | 8/2001 | Tanaka et al. | |
| 2003/0173573 A1 | 9/2003 | Udagawa | |
| 2005/0087746 A1* | 4/2005 | Kryliouk et al. | 257/79 |

FOREIGN PATENT DOCUMENTS

| | | |
|---|---|---|
| JP | 55-3834 B2 | 1/1980 |
| JP | 60-207332 A | 10/1985 |
| JP | 2-46779 A | 2/1990 |
| JP | 2-177577 A | 7/1990 |
| JP | 2-275682 A | 11/1990 |
| JP | 2-288371 A | 11/1990 |
| JP | 2-288388 A | 11/1990 |
| JP | 4-84486 A | 3/1992 |
| JP | 2001-176804 A | 6/2001 |
| JP | 2003-229599 A | 8/2003 |
| JP | 2003-303779 A | 10/2003 |
| JP | 2004-47847 A | 2/2004 |
| JP | 2004-119423 A | 4/2004 |
| JP | 2004-153168 A | 5/2004 |
| JP | 2004-165564 A | 6/2004 |
| WO | WO 02/097861 A2 | 12/2002 |
| WO | WO 03/065465 A2 | 8/2003 |

OTHER PUBLICATIONS

Iwao Teramoto, "Introduction of Semiconductor Device", Baihukan, Mar. 30, 1995, p. 28.

Sir Peter Hirsch, et al, "Electron Microscopy of Thin Crystal", (USA), Krieger Pub. Com., 1977, pp. 141-148.

Y. Kumasiro, et al, "Preparation and Electrical Properties of Boron and Boron Phosphide Films Obtained by Gas Source Molecular Beam Deposition", Journal of Solid State Chemistry, vol. 133, 1997, pp. 269-272.

Yukinobu Kumashiro, "Electric Refractory Materials", (USA), Marcel Dekker Inc., 2000, pp. 409-411.

* cited by examiner

COMPOUND SEMICONDUCTOR DEVICE, PRODUCTION METHOD OF COMPOUND SEMICONDUCTOR DEVICE AND DIODE

CROSS-REFERENCE TO RELATED APPLICATION

This application claims the benefit pursuant to 35 U.S.C 119(e)(1) of U.S. Provisional Application No. 60/560,268, filed Apr. 8, 2004.

TECHNICAL FIELD

The present invention relates to a compound semiconductor device having a hexagonal silicon carbide crystal substrate and a boron phosphide material layer provided on the substrate, to a method for producing the device, and to a diode including the semiconductor device.

Priority is claimed on Japanese Patent Application No. 2004-098876, filed Mar. 30, 2004, the content of which is incorporated herein by reference.

BACKGROUND ART

Silicon carbide (SiC) is known to have a variety of crystal structure types such as cubic (so-called β-type) and hexagonal (so-called α-type) and to exhibit a wide bandgap (Non-Patent Document 1).

For example, a crystal substrate composed of cubic β-type silicon carbide has a wide bandgap and is transparent with respect to light emitted from a UV semiconductor layer. Therefore, the substrate is employed as a transparent crystal substrate (see Patent Document 1).

A UV semiconductor laser having a crystal substrate composed of cubic β-type silicon carbide and component layers such as a light-emitting layer formed on the substrate can emit light through the top surface as well as through a side surface or a backside surface, leading to excellent light extraction efficiency.

Hexagonal α-type silicon carbide (SiC) represented by a Ramsdell symbol of 2H (wurtzite), 4H, or 6H is employed as a substrate material for forming a compound semiconductor light-emitting device such as a gallium nitride (GaN) light-emitting diode (hereinafter may be referred to as LED).

For example, there is disclosed a blue-light-emitting device having an α-type silicon carbide crystal substrate with a {0001} crystal plane as a surface, and a light-emitting layer composed of gallium indium nitride ($Ga_YIn_ZN$: $0 \leq Y, Z \leq 1$, Y+Z=1) deposited on the surface (see Patent Document 2).

Silicon carbide (SiC) is also employed as a substrate material. For example, a compound semiconductor light-emitting device having a grown layer deposited on a silicon carbide (SiC) single-crystal substrate is disclosed (see Patent Document 3).

Meanwhile, hexagonal silicon carbide (SiC) has an a-axis lattice constant (a) of 0.308 nm, which is almost equivalent to the a-axis lattice constant (a) of gallium nitride (GaN) (0.319 nm). Therefore, hexagonal silicon carbide (SiC) and gallium nitride (GaN) can be joined together with few misfit dislocations.

A pn-junction light-emitting diode based on the lattice matching property is disclosed, the diode having a hetero-junction structure including a p-type silicon carbide (SiC) layer and an n-type hexagonal aluminum gallium nitride (compositional formula: $Al_XGa_YN$: $0 \leq X, Y \leq 1$, X+Y=1) layer (see Patent Document 4).

A blue-light-emitting device having a junction structure between a p-type silicon carbide (SiC) single crystal and an n-type silicon carbide (SiC) single crystal is also disclosed (see Patent Document 5).

As described above, some cases where a light-emitting layer composed of silicon carbide (SiC) is used have been disclosed. However, in general, silicon carbide (SiC) serves as a substrate material, and a compound semiconductor device having grown layers deposited on a silicon carbide (SiC) crystal substrate as disclosed in Patent Documents 1 to 3 is employed in a variety of fields.

When a silicon carbide (SiC) crystal substrate is employed, component layers including a light-emitting layer are not directly formed in the crystal substrate. There are disclosed methods for forming a light-emitting device including forming a boron phosphide (BP) buffer layer on a silicon carbide (SiC) crystal substrate, followed by formation of component layers including a light-emitting layer (see Patent Documents 6 and 7).

Another compound semiconductor light-emitting device is disclosed in which a super-lattice layer including a boron phosphide (BP) buffer layer is formed on a silicon carbide (SiC) crystal substrate (see Patent Document 8).

[Non-Patent Document 1]
Y. Kumashiro, Electric Refractory Materials, (USA), Marcel Dekker Inc., (2000), p. 409-411

[Patent Document 1]
Japanese Patent Application Laid-Open (kokai) No. 4-84486

[Patent Document 2]
Japanese Patent Publication (kokoku) No. 55-3834

[Patent Document 3]
Japanese Patent Application Laid-Open (kokai) No. 60-207332

[Patent Document 4]
Japanese Patent Application Laid-Open (kokai) No. 2-177577

[Patent Document 5]
Japanese Patent Application Laid-Open (kokai) No. 2-46779

[Patent Document 6]
Japanese Patent Application Laid-Open (kokai) No. 2-275682

[Patent Document 7]
Japanese Patent Application Laid-Open (kokai) No. 2-288388

[Patent Document 8]
Japanese Patent Application Laid-Open (kokai) No. 2-288371

DISCLOSURE OF INVENTION

In contrast to a hexagonal Group III nitride compound semiconductor such as a compound represented by the compositional formula: $Al_XGa_YN$ ($0 \leq X, Y \leq 1$, X+Y=1), boron phosphide (BP) of a sphalerite crystal structure type has a degenerated valence band (see Patent Document 6, page 2, lower right column of the specification, and FIG. 7).

Therefore, a p-type conductive layer is readily formed from boron phosphide (BP). As disclosed in Patent Document 6, conventionally, a p-type magnesium (Mg)-doped boron phosphide (BP) layer having a bandgap of 2.0 eV is employed as a contact layer of a laser diode (LD).

Meanwhile, boron phosphide (BP) assumes a sphalerite-type crystal structure having a lattice constant of 0.454 nm (Iwao Teramoto, "Introduction of Semiconductor Device," Mar. 30 (1995) Baihukan, p. 28).

Thus, the degree of lattice mismatch between boron phosphide (BP) and 6H-type (hexagonal) silicon carbide (a-axis lattice constant (a)=0.308 nm) is as considerably large as 47.3% (based on 6H-type (hexagonal) silicon carbide).

Therefore, when hexagonal silicon carbide (SiC) crystal substrate is employed, a boron phosphide (BP) layer having excellent crystallinity cannot be reliably formed. In other words, compound semiconductor devices exhibiting excellent breakdown voltage characteristics have not yet been reliably provided.

The present invention has been conceived in an attempt to solve the aforementioned problems involved in conventional techniques. Thus, an object of the present invention is to provide a compound semiconductor device having a hexagonal silicon carbide crystal substrate and a boron-phosphide-based semiconductor crystal layer deposited on the substrate, the device exhibiting excellent breakdown voltage characteristics. Another object of the invention is to provide a method for producing a compound semiconductor device, which method enables formation of a boron-phosphide-based semiconductor crystal layer on a silicon carbide crystal substrate with high lattice-matching degree, resulting in excellent breakdown voltage characteristics. Still another object of the invention is to provide a pn-junction diode exhibiting excellent breakdown voltage characteristics.

The aforementioned objects can be attained by the following.

(1) A compound semiconductor device comprising: a hexagonal silicon carbide crystal substrate; and a boron-phosphide-based semiconductor layer formed on the silicon carbide crystal substrate, wherein the silicon carbide crystal substrate has a surface assuming a {0001} crystal plane, and the boron-phosphide-based semiconductor layer is composed of a crystal having a surface assuming a {111} crystal plane (hereinafter referred to as a {111} crystal), the crystal being stacked on and in parallel with the {0001} crystal plane of the silicon carbide crystal substrate, and when the number of the layers contained in one periodical unit of an atomic arrangement in the [0001] crystal orientation of the silicon carbide crystal substrate is n, an n-layer-stacked structure included in the {111} crystal plane forming the {111} crystal has a stacking height virtually equal to the c-axis lattice constant of the silicon carbide crystal substrate.

(2) A compound semiconductor device as recited in (1), wherein the {111} crystal forming the boron-phosphide-based semiconductor layer is stacked on the silicon carbide substrate in a line-symmetric manner with respect to the a-axis of the {0001} crystal plane of the silicon carbide crystal substrate.

(3) A compound semiconductor device as recited in (1), wherein the boron-phosphide-based semiconductor layer is composed of an undoped boron-phosphide-based semiconductor to which an impurity element for controlling the conduction type has not been intentionally added.

(4) A compound semiconductor device as recited in (1), wherein the boron-phosphide-based semiconductor layer contains twins each having a {111} crystal plane serving as a twinning plane.

(5) A method for producing a compound semiconductor device having a hexagonal silicon carbide crystal substrate and a boron-phosphide-based semiconductor layer formed on the silicon carbide crystal substrate, comprising: feeding at least a boron-containing compound and a phosphorus-containing compound into a vapor phase growth zone to thereby form a boron-phosphide-based semiconductor layer on a surface of a silicon carbide crystal substrate assuming a {0001} crystal plane serving as a base layer, wherein the boron-phosphide-based semiconductor layer is composed of a {111} crystal, the crystal being formed on the {0001} crystal plane of the silicon carbide crystal substrate, and when the number of the layers contained in one periodical unit of an atomic arrangement in the [0001] crystal orientation of the silicon carbide crystal substrate is n, an n-layer-stacked structure included in the {111} crystal plane forming the {111} crystal has a stacking height virtually equal to the c-axis lattice constant of the silicon carbide crystal substrate.

(6) A method for producing a compound semiconductor device as recited in (5), wherein the boron-phosphide-based semiconductor layer is formed at 750° C. to 1,200° C.

(7) A method for producing a compound semiconductor device as recited in (5), wherein the boron-phosphide-based semiconductor layer is formed at a growth rate of 2 nm/min to 30 nm/min.

(8) A method for producing a compound semiconductor device as recited in (5), wherein the boron-phosphide-based semiconductor layer is formed at a growth rate of 20 nm/min to 30 nm/min in an initial stage of formation of the boron-phosphide-based semiconductor layer.

(9) A diode comprising: a boron-phosphide-based semiconductor layer, serving as a p-type layer or an n-type layer, formed on a {0001} crystal plane of a hexagonal silicon carbide crystal substrate, wherein the boron-phosphide-based semiconductor layer is composed of a {111} crystal, the crystal being formed on the {0001} crystal plane of the silicon carbide crystal substrate, and when the number of the layers contained in one periodical unit of an atomic arrangement in the [0001] crystal orientation of the silicon carbide crystal substrate is n, an n-layer-stacked structure included in the {111} crystal plane forming the {111} crystal has a stacking height virtually equal to the c-axis lattice constant of the silicon carbide crystal substrate.

In the compound semiconductor device of the present invention, an n-layer-stacked structure included in the {111} crystal plane forming the {111} crystal has a stacking height virtually equal to the c-axis lattice constant of the silicon carbide crystal substrate. Thus, excellent lattice matching can be realized between the silicon carbide crystal substrate and the boron-phosphide-based semiconductor layer both in the planar direction and the stacking direction. Therefore, for example, excellent rectifying characteristics and breakdown voltage characteristics can be attained.

Since the {111} crystal forming the boron-phosphide-based semiconductor layer is stacked on the silicon carbide substrate in a line symmetric manner with respect to the a-axis of the {0001} crystal plane of the silicon carbide crystal substrate, more excellent lattice matching can be attained between the silicon carbide crystal substrate and the boron-phosphide-based semiconductor layer. Therefore, an excellent boron-phosphide-based semiconductor layer having few misfit dislocations can be produced, and excellent rectifying characteristics and breakdown voltage characteristics can be attained.

Since the boron-phosphide-based semiconductor layer is composed of an undoped boron-phosphide-based semiconductor to which an impurity element for controlling the conduction type has not been intentionally added, leak current is reduced, and excellent breakdown voltage characteristics can be attained.

Since the boron-phosphide-based semiconductor layer contains twins each having a {111} crystal plane serving as a twinning plane, lattice mismatch is mitigated, whereby leak current is reduced, and excellent breakdown voltage characteristics can be attained.

Preferably, the twins are contained in large amounts in an area in the vicinity of the hetero-junction interface between the silicon carbide crystal and the boron-phosphide-based semiconductor layer, whereby lattice mismatch is effectively mitigated.

According to the method for producing a compound semiconductor device, a boron-phosphide-based semiconductor layer which highly lattice-matches the silicon carbide crystal substrate both in the planar direction and the stacking direction can be produced. Thus, a compound semiconductor device exhibiting excellent rectifying characteristics and breakdown voltage characteristics can be fabricated.

In the pn-junction diode of the present invention, excellent lattice matching can be attained between the silicon carbide crystal substrate and the boron-phosphide-based semiconductor layer. In addition, excellent rectifying characteristics and breakdown voltage characteristics can be attained through utilization of excellent breakdown voltage characteristics provided by a hexagonal silicon carbide single crystal.

BEST MODE FOR CARRYING OUT THE INVENTION

[Compound Semiconductor Device]

Figure 1:
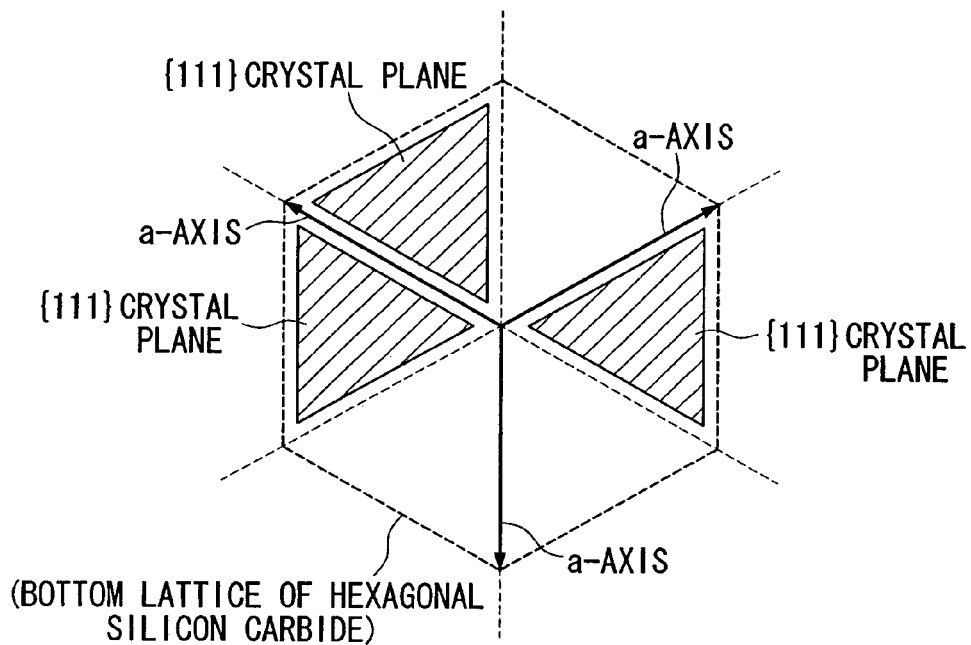
FIG. 1 is a schematic plan view showing a crystal arrangement including a {0001} crystal plane of silicon carbide crystal substrate and a boron-phosphide-based semiconductor layer formed on the substrate.

The compound semiconductor device of the present invention has a hexagonal silicon carbide crystal substrate and a boron-phosphide-based semiconductor layer formed on the silicon carbide crystal substrate.

The hexagonal silicon carbide forming a base layer for the growth of the boron-phosphide-based semiconductor layer is represented by "n·H type" in accordance with the Ramsdell symbols (see the aforementioned Non-Patent Document 1, "Electric Refractory Materials," p. 409-411).

In the above symbol, the numeral "n" represents the number of layers contained in one periodical unit of atomic arrangement in the crystal in the stacking direction, and is generally a positive, even number (e.g., 2, 4, 6, 8, or 10). The numeral "H" represents that the crystal system is hexagonal. Examples of the type of hexagonal silicon carbide include 2H-type, 4H-type, and 6H-type.

The surface of the hexagonal silicon carbide crystal substrate is preferred as a {0001} crystal plane or a crystal plane slanted in the [11-20] crystal orientation by $\leqq 10°$ with the {0001} crystal plane. For examples, a crystal plane inclined to the [11-20] crystal orientation by 3.5° or 8.0° with the {0001} crystal plane is preferred as the inclined crystal plane.

In the case where the compound semiconductor device is a light-emitting device, the silicon carbide crystal substrate is preferably composed of an n-type or a p-type conductive silicon carbide single crystal. Through employment of the preferred substrate, an Ohmic electrode for flowing device operation current can be formed on a silicon carbide crystal substrate.

In the case where the compound semiconductor device is a Schottky junction field-effect transistor (MESFET) such as a modulation-doped high-electron-mobility field-effect transistor (abbreviated as MODFET), the silicon carbide crystal substrate is preferably formed of a semi-conducting silicon carbide single crystal.

The boron-phosphide (BP)-based semiconductor forming the boron-phosphide-based semiconductor layer provided on the silicon carbide crystal substrate is a type of compound semiconductor containing as essential elements, boron (B) and phosphorus (P).

Examples of the compound semiconductor include compounds represented by a compositional formula: $B_\alpha Al_\beta Ga_\gamma In_{1-\alpha-\beta-\gamma} P_{1-\delta} As_\delta (0<\alpha\leqq 1,\ 0\leqq\beta<1,\ 0\leqq\gamma<1,\ 0<\alpha+\beta+\gamma\leqq 1,\ 0\leqq\delta<1)$; and compounds represented by a compositional formula: $B_\alpha Al_\beta Ga_\gamma In_{1-\alpha-\beta-\gamma} P_{1-\epsilon} N_\epsilon (0<\alpha\leqq 1,\ 0\leqq\beta<1,\ 0\leqq\gamma<1,\ 0<\alpha+\beta+\gamma\leqq 1,\ 0\leqq\epsilon<1)$.

The boron-phosphide (BP)-based semiconductor preferably contains three or less component elements, whereby an excellent mixed crystal layer having consistent compositional proportions can be readily formed. Examples include boron monophosphide (BP), and boron arsenide phosphide (compositional formula: $B_\alpha P_{1-\delta} As_\delta,\ 0\leqq\delta<1$) and boron nitride phosphide (compositional formula: $BP_{1-\epsilon} N_\epsilon, 0\leqq\epsilon<1$), which contain three or less component elements and a plurality of (2) Group V elements.

More preferably, the boron-phosphide (BP)-based semiconductor containing three or less component elements has a crystal plane having a lattice constant or a lattice spacing which is virtually equivalent to the a-axis lattice constant of hexagonal silicon carbide. When a boron-phosphide (BP)-based semiconductor layer is formed on a hexagonal silicon carbide substrate under the above conditions, an excellent boron-phosphide-based semiconductor layer having few lattice mismatch and few misfit dislocations can be readily produced.

Examples of such a boron-phosphide (BP)-based semiconductor include boron nitride phosphide ($BP_{0.8}N_{0.2}$) having a nitrogen (N) composition ($\epsilon$) of 0.2 (=20%). The boron nitride phosphide ($BP_{0.8}N_{0.2}$) has a wurtzite-type crystal structure and a lattice spacing of the {110} crystal plane of about 0.308 nm, which is virtually equivalent to the a-axis lattice constant of 6H-type silicon carbide (SiC) (=0.308 nm).

The boron-phosphide-based semiconductor layer is preferably composed of a so-called undoped boron-phosphide-based semiconductor to which an impurity element for controlling the conduction type has not been intentionally added.

The undoped boron-phosphide-based semiconductor layer can three-dimensionally match the hexagonal silicon carbide crystal substrate in a planar direction (a-axis direction) and a vertical direction (c-axis direction) in terms of crystal lattice dimensions. When another component layer such as a light-emitting layer is formed on the boron-phosphide-based semiconductor layer, diffusion of an impurity element into the component layer can be reduced.

Crystal structures of the hexagonal silicon carbide crystal substrate and the boron-phosphide-based semiconductor layer, which constitute the gist of the present invention, will next be described in detail.

FIG. 1 is a schematic plan view showing a crystal arrangement including a {0001} crystal plane of silicon carbide crystal substrate and a boron-phosphide-based semiconductor layer formed on the substrate.

In the {0001} crystal plane of a hexagonal silicon carbide single crystal, a plurality of hexagonal-plan-view unit cells (planar crystal lattice units) are arranged at high density. On the {0001} crystal plane of the silicon carbide crystal substrate, a {111} crystal forming the boron-phosphide-based semiconductor layer is provided such that the {111} plane is in parallel with the {0001} crystal plane.

As shown in FIG. 1, the {111} crystal plane of the sphalerite-type boron-phosphide-based semiconductor layer is triangular in plan view. Each of three sides of the triangular {111} crystal plane is arranged in the [110] crystal orientation of the {111} crystal plane.

Therefore, when each side of the triangular {111} crystal plane extends in parallel with and an a-axis of the hexagonal plan-view bottom lattice (unit cell) of the silicon carbide crystal substrate {0001} crystal plane, the {111} crystal of the boron-phosphide-based semiconductor layer is disposed and stacked on the silicon carbide crystal substrate such that the {111} crystal plane fits the planer shape of the bottom lattice of the {0001} crystal plane of the silicon carbide crystal substrate. In other words, the [110] crystal orientation of the {111} crystal plane of the boron-phosphide-based semiconductor layer extends in parallel with a-axis of the bottom lattice of the hexagonal silicon carbide crystal substrate (i.e., the {111} crystal plane is arranged in a reflective symmetric manner (a line-symmetric manner) with respect to the a-axis of the silicon carbide crystal substrate. Under the above conditions, lattice matching between the silicon carbide crystal substrate and the boron-phosphide-based semiconductor layer can be most fully attained.

Crystal orientation of the boron-phosphide-based semiconductor layer formed on the {0001} crystal plane of the hexagonal silicon carbide crystal substrate may be determined through, for example, X-ray diffraction or electron diffraction techniques.

For example, an incident electron beam is applied in the direction identical to the [110] crystal orientation of the boron-phosphide-based semiconductor layer, and a transmission electron diffraction (TED) pattern of the boron-phosphide-based semiconductor layer is captured. When, in the electron diffraction pattern, both of diffraction spots attributed to the {0001} crystal plane of the silicon carbide crystal substrate and those attributed to the {111} crystal plane of the boron-phosphide-based semiconductor layer appear in the c-axis direction of the silicon carbide crystal substrate, and a reverse lattice of the {110} crystal plane of the boron-phosphide-based semiconductor layer is observed in a line-symmetric manner with respect to a plan axis (e.g., a-axis) of the silicon carbide crystal substrate, the results indicate that the {111} crystal plane of the boron-phosphide-based semiconductor layer is formed on the {0001} crystal plane of the silicon carbide crystal substrate in a line-symmetric manner with respect to a plan axis (e.g., a-axis) of the silicon carbide crystal substrate. Briefly, the {111} crystal forming the boron-phosphide-based semiconductor layer is formed on the {0001} crystal plane in a line-symmetric manner with respect to a plan axis (e.g., a-axis) of the silicon carbide crystal substrate.

Figure 2:
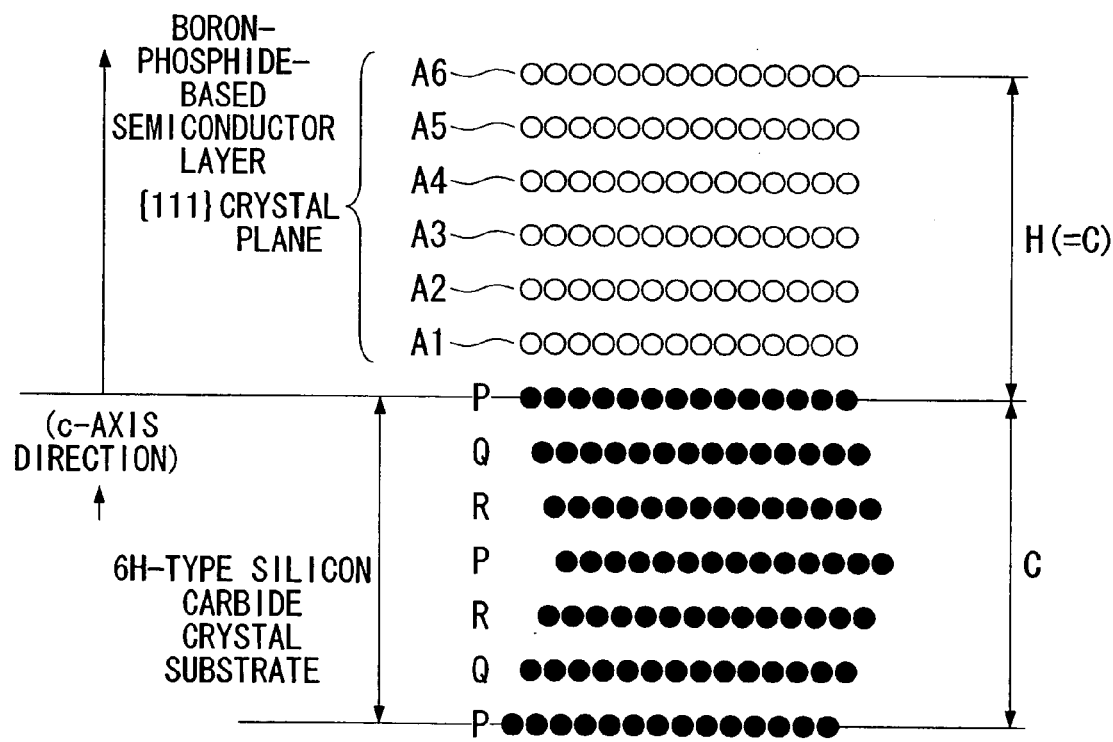
FIG. 2 is a plan view schematically showing the crystal arrangement feature, in the stacking direction, of the {0001} crystal plane of a 6H-type silicon carbide crystal substrate and a boron-phosphide-based semiconductor layer.

FIG. 2 is a plan view schematically showing the crystal arrangement feature, in the stacking direction, of the {0001} crystal plane of a 6H-type silicon carbide crystal substrate and a boron-phosphide-based semiconductor layer formed on the substrate.

FIG. 2 shows an exemplary silicon carbide crystal substrate formed of a 6H-type silicon carbide single crystal. In FIG. 2, P represents the first atomic arrangement layer in the [0001] crystal orientation (c-axis direction) normal to the {0001} crystal plane, and similarly, Q and R represent the second and the third atomic arrangement layers, respectively. In the stacking structure shown in FIG. 2, the number (n) of layers included in one periodical unit of an atomic arrangement is 6.

In the boron-phosphide-based semiconductor layer formed on the {0001} crystal plane of the 6H-type silicon carbide crystal substrate, an n-layer-stacked structure included in the {111} crystal plane forming the {111} crystal has a stacking height virtually equal to the c-axis lattice constant (c) of the silicon carbide crystal substrate. In FIG. 2, a boron phosphide layer is provided as the boron-phosphide-based semiconductor layer, and the structure A1 to A6 (6 layers, n=6) included in the {111} crystal plane has a height (h) just coinciding with the c-axis lattice constant (c) of the 6H-type silicon carbide serving as the silicon carbide crystal substrate.

Thus, the boron-phosphide-based semiconductor layer is formed on the silicon carbide crystal substrate in such a manner that an n-layer-stacked structure included in the {111} crystal plane forming the {111} crystal has a stacking height (H) virtually equal to the c-axis lattice constant (c) of a hexagonal n·H-type silicon carbide crystal substrate.

Preferably, the boron-phosphide-based semiconductor layer contains twins each having a {111} crystal plane serving as a twinning plane.

More preferably, the twins are contained in large amounts in an area in the vicinity of the hetero-junction interface between the silicon carbide crystal substrate and the boron-phosphide-based semiconductor layer.

By virtue of the twins contained in an area in the vicinity of the junction interface (hetero-junction interface) between the silicon carbide crystal substrate and the boron-phosphide-based semiconductor layer, particularly the twins each having a {111} crystal plane serving as a twinning plane, mismatch between the silicon carbide crystal substrate and the boron-phosphide-based semiconductor layer can be mitigated, whereby a boron-phosphide-based semiconductor layer high crystallinity with few misfit dislocations can be formed.

The presence of twins inside the boron-phosphide-based semiconductor layer can be determined on the basis of, for example, anomalous diffraction spots attributed to twins observed in an electron-beam diffraction (TED) pattern (see P. Hirsch et al., "ELECTRON MICROSCOPY OF THIN CRYSTAL," (USA), Krieger Pub. Com. (1977) p. 141-148). The density of twins may be obtained by counting twin crystal grain boundaries present in a predetermined area as observed a cross-section image of the boron-phosphide-based semiconductor layer captured by a cross-section transmission electron microscope.

As described above, according to the present invention, an n-layer-stacked structure included in the {111} crystal plane forming the {111} crystal has a stacking height (H) virtually equal to the c-axis lattice constant of the silicon carbide crystal substrate. Thus, excellent lattice matching can be realized between the silicon carbide crystal substrate and the boron-phosphide-based semiconductor layer both in the planar direction and the stacking direction. Therefore, for example, excellent rectifying characteristics and breakdown voltage characteristics can be attained.

The compound semiconductor device of the present invention finds a variety of uses as follows.

When the boron-phosphide-based semiconductor layer is formed of an undoped boron-phosphide-based semiconductor layer, the layer may serve as an n-type or a p-type low-resistance layer of a variety of semiconductor devices, by virtue of the undoped nature thereof.

As mentioned above, since the undoped boron-phosphide-based semiconductor layer contains no impurity element which has been intentionally added (doped) to the layer, when the compound semiconductor device of the present invention is applied to a light-emitting device, diffusion of an impurity element to a light-emitting layer can be prevented. Thus, an undoped boron-phosphide-based semiconductor layer having a wide bandgap can be effectively employed as a cladding layer which does not impair characteristics of the light-emitting layer, the impairment otherwise being caused by diffusion of an impurity element.

Specifically, a Group III nitride semiconductor light-emitting device may be fabricated from a cladding layer composed of an undoped boron-phosphide-based semiconductor layer and other layers including a light-emitting layer composed of a Group III nitride semiconductor formed on the undoped boron-phosphide-based semiconductor layer.

In this case, since the compound semiconductor device of the present invention is provided with an undoped boron-phosphide-based semiconductor layer instead of a cladding layer composed of a conventional magnesium (Mg)-doped $Al_XGa_YIn_ZN$ ($0 \leq X, Y, Z \leq 1$, $X+Y+Z=1$), variation in carrier concentration of the light-emitting layer and deterioration of crystallinity of the light-emitting layer, which have conventionally been caused by diffusion of Mg, can be avoided. Thus, light of a predetermined wavelength can be reliably emitted without virtually causing variation in forward voltage (Vf) and emission wavelength.

Particularly when a light-emitting device is fabricated from a compound semiconductor device including a boron-phosphide-based semiconductor layer having a band gap at room temperature of 2.8 eV to 5.0 eV, the boron-phosphide-based semiconductor layer can be effectively employed as a window layer through which UV light or short-wavelength visible light emitted from the light-emitting layer is transmitted to the outside. Alternatively, the boron-phosphide-based semiconductor layer may be employed as a cladding layer for a light-emitting layer composed of a Group III nitride semiconductor such as aluminum gallium indium nitride ($Al_XGa_YIn_ZN$: $0 \leq X, Y, Z \leq 1$, $X+Y+Z=1$) or gallium nitride phosphide (compositional formula: $GaP_{1-\epsilon}N_\epsilon$, $0 \leq \epsilon \leq 1$).

However, when a boron-phosphide-based semiconductor layer having a bandgap in excess of 5.0 eV is used, difference in barrier between the semiconductor layer and the light-emitting layer excessively increases. Such a feature is disadvantageous for producing a compound semiconductor light-emitting device exhibiting low forward voltage or threshold voltage.

By virtue of a wide bandgap, the compound semiconductor device of the present invention having the boron-phosphide-based semiconductor layer may be used in a two-dimensional electron gas field-effect transistor (TEGFET).

For example, the boron-phosphide-based semiconductor layer may serve as an electron-supplying layer for supplying carriers (electrons) for forming two-dimensional electron gas (TEG) in a channel layer composed of gallium indium nitride ($Ga_YIn_ZN$: $0 \leq Y, Z \leq 1$, $Y+Z=1$).

According to the present invention, the {111} crystal forming the boron-phosphide-based semiconductor layer is stacked on the {0001} crystal plane of the silicon carbide crystal substrate such that the {0001} crystal plane is in parallel with the {111} crystal plane. Therefore, in contrast to a conventional electron-supplying layer composed of a hexagonal Group III nitride semiconductor such as $Al_XGa_YN$ ($0 \leq X, Y \leq 1$, $X+Y=1$), the boron-phosphide-based semiconductor layer can be employed as an electron-supplying layer exhibiting less piezoelectric effect, which adversely affects accumulation of two-dimensional electron gas.

An n-type low-resistance boron-phosphide-based semiconductor layer may be employed as a contact layer for forming a source electrode, a drain electrode, and an Ohmic electrode provided on the electron-supplying layer.

[Method for Producing a Compound Semiconductor Device]

Firstly, a crystal substrate composed of a hexagonal silicon carbide single crystal having a surface assuming a {0001} crystal plane is provided.

On the {0001} crystal plane of the hexagonal silicon carbide crystal substrate, a boron-phosphide-based semiconductor layer is formed through a vapor phase growth means such as the halogen method, the halide method, or MOCVD (metal-organic chemical vapor deposition), by supplying at least a boron-containing compound and a phosphorus-containing compound into a vapor phase growth zone.

Alternatively, molecular-beam epitaxy may also be employed (see J. Solid State Chem., 133(1997), p. 269-272).

For example, a p-type or an n-type boron monophosphide (BP) layer serving as the boron-phosphide-based semiconductor layer may be formed through an atmospheric pressure (near atmospheric pressure) or reduced-pressure MOCVD by use of triethylborane (molecular formula: $(C_2H_5)_3B$) and phosphine (molecular formula: $PH_3$) as sources. The p-type boron monophosphide (BP) layer is preferably formed at a formation temperature (growth temperature) of 1,000° C. to 1,200° C. The source supply ratio (V/III ratio; e.g., $PH_3/(C_2H_5)_3B$) during formation of the layer is preferably 10 to 50 and more preferably 20 to 40.

As used herein, the term "V/III ratio" refers to a ratio of atomic concentration of Group V elements including phosphorus to atomic concentration of Group III elements including boron, these sources being supplied to the vapor phase growth zone.

The n-type boron monophosphide (BP) layer is preferably formed at a formation temperature of 700° C. to 1,000° C. The source supply ratio (V/III ratio) for forming the n-type boron phosphide (BP) layer is preferably 200 or higher and 2000 or less, more preferably 400 or higher and 1000 or less.

Through precise control of formation rate in addition to formation temperature and V/III ratio, there can be formed a boron-phosphide-based semiconductor having a wide bandgap.

For example, during formation of the aforementioned boron monophosphide layer through MOCVD, a boron phosphide layer having a bandgap at room temperature of 2.8 eV or more can be produced through control of the formation rate (growth rate) so as to fall within a range of 2 nm/min to 30 nm/min. (see pamphlet of WO02/097861).

The bandgap may be determined on the basis of photon energy ($=h \cdot v$) dependency of absorbance or on the basis of photon energy dependency of a product ($=2n \cdot k$) of refractive index (n) and extinction coefficient (k).

Formation of a boron monophosphide layer has been described as an example. Specifically, through control of formation temperature (growth temperature), V/III ratio, and formation rate (growth rate) to fall within the aforementioned ranges (700° C. to 1,200° C., 10 to 50 or 200 or more and 2000 or less, and 2 nm/min to 30 nm/min, respectively), a boronphosphide-based semiconductor layer having a {111} crystal can be formed on the {0001} crystal plane of the hexagonal silicon carbide crystal substrate such that the a-axis of hexagonal silicon carbide extends in parallel with the [110] crystal orientation.

Briefly, a boron-phosphide-based semiconductor layer having a {111} crystal can be formed on the {0001} crystal plane of the hexagonal silicon carbide crystal substrate such that the {111} crystal is stacked in a line-symmetric manner with respect to the a-axis of the {0001} crystal plane of the silicon carbide crystal substrate.

Alternatively, through control of formation temperature, V/III ratio, and formation rate to fall within the aforementioned ranges, a boron-phosphide-based semiconductor layer can be formed such that the {111} crystal is stacked with virtually matching the c-axis of the hexagonal silicon carbide crystal substrate.

For example, when a 4H-type silicon carbide crystal substrate is used as the silicon carbide crystal substrate, a boron-phosphide-based semiconductor layer can be formed such that the stacking height of a 4-layer stacked structure included in the {111} crystal plane of the boron-phosphide-based semiconductor layer virtually coincides the c-axis lattice constant (=1.005 nm) of the silicon carbide crystal substrate.

When a 6H-type silicon carbide crystal substrate is used as the silicon carbide crystal substrate, a boron-phosphide-based semiconductor layer can be formed such that the stacking height of a 6-layer stacked structure included in the {111} crystal plane of the boron-phosphide-based semiconductor layer virtually coincides the c-axis lattice constant (c=1.512 nm) of the silicon carbide crystal substrate.

Briefly, through employment of an n·H-type silicon carbide crystal substrate having a surface assuming a {0001} crystal plane and through control of formation temperature, V/III ratio, and formation rate to fall within the aforementioned ranges, a boron-phosphide-based semiconductor layer containing a {111} crystal can be formed in a highly ordered manner such that an n-layer stacked structure included in the {111} crystal plane forming the {111} crystal of the boron-phosphide-based semiconductor has a stacking height virtually equivalent to the c-axis lattice constant of the silicon carbide crystal substrate. Thus, a boron-phosphide-based semiconductor layer highly lattice-matches a silicon carbide crystal substrate also in the vertical direction (direction normal to the surface of the silicon carbide crystal substrate) can be formed.

As a case where any of the conditions of formation temperature, V/III ratio, and formation rate fall outside the above preferred ranged, a case in which a high formation temperature (>1,200° C.) is employed will next be described.

When the formation temperature is higher than 1,200° C., vaporization of boron (B) and phosphorus (P) serving as essential component elements of the boron-phosphide-based semiconductor layer considerably occurs. Thus, a large amount of stacking faults generates in the boron-phosphide-based semiconductor layer, thereby causing the layer to have a disordered stacking structure. In addition, a boron-phosphide-based semiconductor layer which has grown at high temperature may assume a polycrystalline layer containing a {110} crystal plane or a similar crystal plane other than the {111} crystal plane.

Thus, such high temperature is not preferred, since a boron-phosphide-based semiconductor layer in which the {111} crystal plane is arranged in a highly ordered manner on a hexagonal silicon carbide crystal substrate with excellent lattice matching is difficult to form reliably. The aforementioned stacking faults present in the boron-phosphide-based semiconductor layer may be confirmed through analysis of an electron diffraction pattern.

In the present invention, the boron-phosphide-based semiconductor layer is preferably formed on the {0001} crystal plane of an n-H-type (hexagonal) silicon carbide crystal substrate through vapor phase growth at a relatively large growth rate falling within the aforementioned preferred range.

Through employment of such growth rate, a boron-phosphide-based semiconductor layer containing twins each having a {111} crystal plane serving as a twinning plane can be formed.

For example, when a boron-phosphide-based semiconductor layer is formed through vapor phase growth on the {0001} crystal plane of a 6H-type silicon carbide crystal substrate so as to form hetero-junction at a growth rate of 20 nm/min to 30 nm/min, a boron-phosphide-based semiconductor layer containing twins each having a {111} crystal plane serving as a twinning plane can be formed. When a boron-phosphide-based semiconductor layer is grown at the aforementioned rapid growth rate particularly in an initial stage for hetero-growing a boron-phosphide-based semiconductor layer on a silicon carbide crystal substrate, twins can be generated in large amounts in an area in the vicinity of the hetero-junction interface between the silicon carbide crystal substrate and the boron-phosphide-based semiconductor layer.

[Diode]

The diode of the present invention includes, as a p-type or an n-type layer, a boron-phosphide-based semiconductor layer of the aforementioned compound semiconductor device of the present invention.

In one exemplary diode, on a p-type or an n-type boron-phosphide-based semiconductor layer included in the compound semiconductor device of the present invention, a layer having a conduction type opposite that of the boron-phosphide-based semiconductor layer is formed.

The diode may have a p-type or an n-type silicon carbide crystal substrate of the compound device of the present invention and a boron-phosphide-based semiconductor layer having a conduction type opposite that of the silicon carbide crystal substrate.

According to the present invention, a high-breakdown-voltage diode can be provided by virtue of excellent breakdown voltage characteristics of a hexagonal silicon carbide single crystal.

The boron-phosphide-based semiconductor layer is particularly preferably an undoped p-type or n-type boron-phosphide-based semiconductor layer to which an n-type or a p-type impurity element for determining conduction type has not been intentionally added. Through employment of such a boron-phosphide-based semiconductor layer, migration and diffusion of the added impurity element (dopant) which would otherwise occur during application of high voltage to the device can be avoided, whereby a diode consistently exhibiting high breakdown voltage can be provided.

EXAMPLES

The present invention will next be described in detail, taking a diode as an example of the compound semiconductor device according to the present invention, which includes a 4H-type (hexagonal) silicon carbide crystal substrate and a boron nitride layer formed as the boron-phosphide-based semiconductor layer on the substrate.

Figure 3:
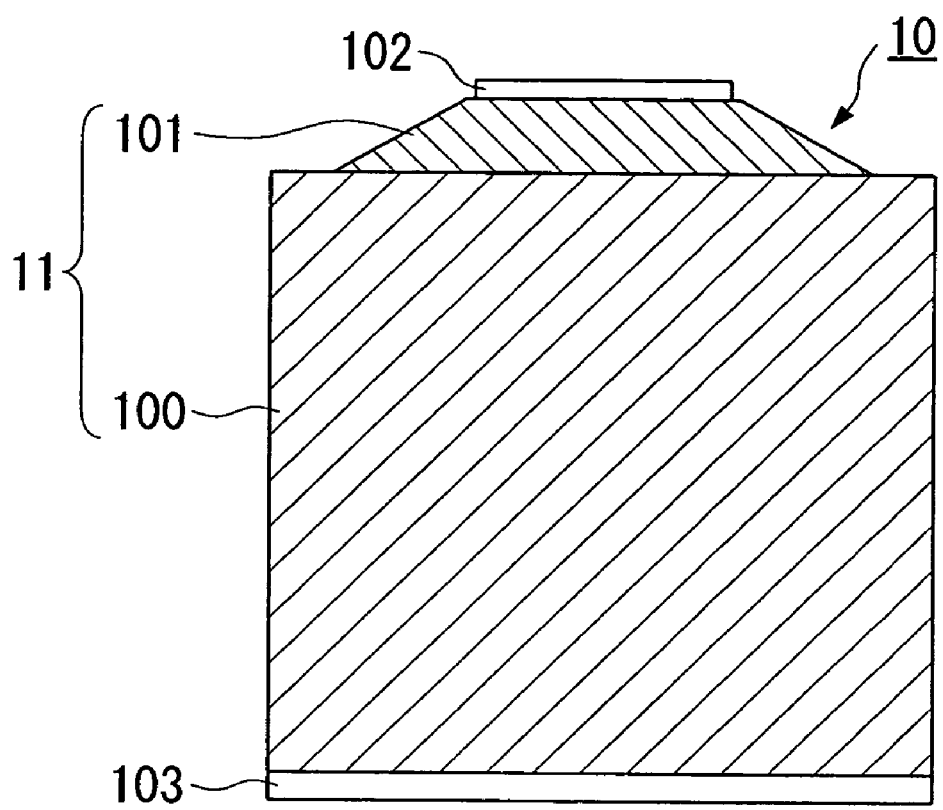
FIG. 3 is a schematic cross-sectional view of a pn-junction diode composed of a stacked structure described in Example 1.

FIG. 3 is a schematic cross-sectional view of a pn-junction diode 10 composed of a stacked structure 11 described in the Example.

The stacked structure 11 was formed through the following procedure.

As a silicon carbide crystal substrate 100, a substrate formed of a 4H-type p-type boron (B)-doped silicon carbide single crystal was provided. The surface of the silicon carbide crystal substrate 100 assumed a crystal plane which was inclined to the [11-20] crystal orientation by 8° from the {0001} crystal plane.

On the {0001} crystal plane of the silicon carbide crystal substrate 100, a boron-phosphide-based semiconductor layer 101 composed of an undoped n-type boron nitride phosphide ($BP_{1-\epsilon}N_\epsilon$: $0 \leq \epsilon < 1$) having a carrier concentration of $2 \times 10^{18}$ $cm^{-3}$ was deposited. The boron nitride phosphide has a sphalerite-type crystal structure.

The layer was formed through an atmospheric pressure (near atmospheric pressure) MOCVD by use of triethylborane (molecular formula: $(C_2H_5)_3B$) as a boron (B) source, ammonia (molecular formula: $NH_3$) as a nitrogen source, and phosphine (molecular formula: $PH_3$) as a phosphorus source.

The growth temperature was adjusted to 950° C. The nitrogen (N) compositional ratio ($\epsilon$) in $BP_{1-\epsilon}N_\epsilon$ forming the boron-phosphide-based semiconductor layer 101 was adjusted to 0.2 so that the layer 101 has a lattice constant matching the a-axis lattice constant (a=0.307 nm) of the 4H-type silicon carbide crystal substrate 100.

During growth (formation) of the layer, the V/III ratio (=$(NH_3+PH_3)/(C_2H_5)_3B$ concentration) was controlled to 600 so that the boron-phosphide-based semiconductor ($BP_{0.8}N_{0.2}$) layer 101 had a bandgap at room temperature of about 4.8 eV.

Through modifying the concentration of $(C_2H_5)_3B$ supplied to the MOCVD growth system, the growth rate in an initial growth stage was adjusted to 30 nm/min. By maintaining at the growth rate, the boron-phosphide-based semiconductor ($BP_{0.8}N_{0.2}$) layer 101 was grown to a thickness of about 20 nm.

Thereafter, the concentration of $(C_2H_5)_3B$ supplied to the MOCVD growth system was reduced so as to lower the growth rate to 15 nm/min. The growth was continued at the growth rate, to thereby form the boron-phosphide-based semiconductor ($BP_{0.8}N_{0.2}$) layer 101 having a thickness of 1,500 nm.

The bandgap of the boron-phosphide-based semiconductor ($BP_{0.8}N_{0.2}$) layer 101, determined at room temperature on the basis of the absorption coefficient, was about 4.8 eV.

Through observation of a selected area electron-beam diffraction pattern of the boron-phosphide-based semiconductor ($BP_{0.8}N_{0.2}$) layer 101, presence of twins was confirmed on the basis of the positions where anomalous diffraction spots appeared. As a result, in the boron-phosphide-based semiconductor ($BP_{0.8}N_{0.2}$) layer 101, twins having a {111} crystal plane serving as a twinning plane were particularly present in an area in the vicinity of the hetero-junction interface between the 4H-type silicon carbide crystal substrate 100 and the boron-phosphide-based semiconductor layer. Such presence of the twins may be attributed to crystal growth at a high growth rate in an initial growth stage.

A cross-section transmission electron microscopic (TEM) image of an area in the vicinity of the hetero-junction interface between the silicon carbide crystal substrate 100 and the boron-phosphide-based semiconductor ($BP_{0.8}NO_2$) layer 101 was captured. The density of twins having a {111} crystal plane serving as a twinning plane in the area was calculated from the number, in the TEM image, of grain boundaries of twins having a {111} crystal plane serving as a twinning plane, and the density was found to be about $5 \times 10^6$ $cm^{-2}$.

Through element analysis by an electron microprobe analysis (EPMA) means, no particular segregation of a metallic impurity element was observed in the hetero-junction interface. The absence of metallic impurity element may be attributed to the fact that the boron-phosphide-based semiconductor ($BP_{0.8}N_{0.2}$) layer 101 was undoped.

In a selected area electron diffraction pattern of the boron-phosphide-based semiconductor ($BP_{0.8}N_{0.2}$) layer 101, diffraction spots obtained from the {111} crystal plane appeared in the same line passing through the diffraction spots obtained from the {000 m} crystal plane (m is an integer; e.g. $-1, 1, -2, 2, -3, 3, \ldots -m, m$) of the 4H-type silicon carbide crystal substrate 100, and virtually in the same positions of the diffraction spots obtained from the {0004} crystal plane of the 4H-type silicon carbide crystal substrate 100.

The results indicated that the boron-phosphide-based semiconductor ($BP_{0.8}N_{0.2}$) layer 101 was grown such that the {111} crystal was formed on the {0001} crystal plane of the 4H-type silicon carbide crystal substrate 100, and a 4-layer stacked structure included in the {111} crystal plane had a stacking height virtually equal to the c-axis lattice constant of the silicon carbide crystal substrate 100.

In the selected area electron diffraction pattern, a reverse lattice of the {110} crystal plane of the boron-phosphide-based semiconductor ($BP_{0.8}N_{0.2}$) layer 101 was observed in a line-symmetric manner with respect to the a-axis of the 4H-type silicon carbide crystal substrate 100.

The results indicated that the boron-phosphide-based semiconductor ($BP_{0.8}N_{0.2}$) layer 101 was formed on the 4H-type silicon carbide crystal substrate 100 such that the [110] crystal orientation of the layer was in parallel with the a-axis direction of the substrate, and contained a {111} crystal stacked on the 4H-type silicon carbide crystal substrate 100 in a line-symmetric manner with respect to the a-axis of the substrate.

The undoped n-type boron-phosphide-based semiconductor ($BP_{0.8}N_{0.2}$) layer 101 having a carrier concentration of $2 \times 10^{18}$ $cm^{-3}$ was processed through a conventional plasma dry etching means employing a halogen-containing gas, to thereby form a mesa. Dry etching so as to form the n-type boron-phosphide-based semiconductor ($BP_{0.8}N_{0.2}$) layer 101 in a mesa shape was performed until the surface of the 4H-type silicon carbide crystal substrate 100 was exposed around the mesa.

Subsequently, on the surface of the mesa, gold (Au)/germanium (Ge) alloy film, nickel (Ni) film, and gold (Au) film were sequentially deposited through a conventional vacuum evaporation means, thereby forming an n-type Ohmic electrode 102 also serving as a pad electrode for wire bonding.

On virtually the entire backside of the silicon carbide crystal substrate 100, a p-type Ohmic electrode 103 composed of nickel (Ni) was provided. Thus, a pn-junction compound semiconductor device 10 was fabricated.

The thus-fabricated pn-junction compound semiconductor device 10 exhibited excellent rectifying characteristics with a forward threshold voltage of about 3.3 V and a reverse leak current of $\leq 10 \mu A$ at 15 V, indicating that a pn-junction diode 10 was provided with high-breakdown-voltage.

By virtue of the twins contained in an area in the vicinity of the hetero-junction interface between the hexagonal silicon carbide crystal 100 and the boron-phosphide-based semiconductor layer 101, the twins each having a {111} crystal plane as a twinning plane, generation of misfit dislocations was prevented. Thus, no local breakdown was observed in the pn-junction diode 10.

INDUSTRIAL APPLICABILITY

The compound semiconductor device of the present invention can be employed as a light-emitting device such as a light-emitting diode or a semiconductor laser or as a two-dimensional electron gas field-effect transistor. The boron-phosphide-based semiconductor layer can be employed as an n-type or a p-type low-resistance layer or as a contact layer for forming a source electrode, a drain electrode, and an Ohmic electrode provided on an electron-supplying layer.

Since the diode of the present invention exhibits high breakdown voltage characteristics with excellent rectifying characteristics, the device can be employed as a light-emitting diode (LED) as well as a variety of pn-junction diodes such as a small signal diode, a rectification diode, a switching diode, a voltage regulator diode (Zener diode), and a variable capacitance diode (varicap).

The invention claimed is:

1. A compound semiconductor device comprising:
a hexagonal silicon carbide crystal substrate; and
a boron-phosphide-based semiconductor layer formed on the silicon carbide crystal substrate, wherein
the silicon carbide crystal substrate has a surface assuming a {0001} crystal plane, and
the boron-phosphide-based semiconductor layer is composed of a {111} crystal stacked on and in parallel with the {0001} crystal plane of the silicon carbide crystal substrate, and
when the number of the layers contained in one periodical unit of an atomic arrangement in the [0001] crystal orientation of the silicon carbide crystal substrate is n, an n-layer-stacked structure included in the {111} crystal plane forming the {111} crystal has a stacking height virtually equal to the c-axis lattice constant of the silicon carbide crystal substrate, and
the {111} crystal forming the boron-phosphide-based semiconductor layer is stacked on the silicon carbide substrate in a line-symmetric manner with respect to the a-axis of the {0001} crystal plane of the silicon carbide crystal substrate.

2. A compound semiconductor device as recited in claim 1, wherein the boron-phosphide-based semiconductor layer is composed of an undoped boron-phosphide-based semiconductor to which an impurity element for controlling the conduction type has not been intentionally added.

3. A compound semiconductor device as recited in claim 1, wherein the boron-phosphide-based semiconductor layer contains twins each having a {111} crystal plane serving as a twinning plane.

4. A method for producing a compound semiconductor device having a hexagonal silicon carbide crystal substrate and a boron-phosphide-based semiconductor layer formed on the silicon carbide crystal substrate, wherein
the silicon carbide crystal substrate has a surface assuming a {0001} crystal plane, and
the boron-phosphide-based semiconductor layer is composed of a {111} crystal stacked on and in parallel with the {0001} crystal plane of the silicon carbide crystal substrate, and
when the number of the layers contained in one periodical unit of an atomic arrangement in the [0001] crystal orientation of the silicon carbide crystal substrate is n, an n-layer-stacked structure included in the {111} crystal plane forming the {111} crystal has a stacking height virtually equal to the c-axis lattice constant of the silicon carbide crystal substrate, and
the {111} crystal forming the boron-phosphide-based semiconductor layer is stacked on the silicon carbide substrate in a line-symmetric manner with respect to the a-axis of the {0001} crystal plane of the silicon carbide crystal substrate,
said method comprising:
feeding at least a boron-containing compound and a phosphorus-containing compound into a vapor phase growth zone to thereby form a boron-phosphide-based semiconductor layer on a surface of a silicon carbide crystal substrate assuming a {0001} crystal plane serving as a base layer.

5. A method for producing a compound semiconductor device as recited in claim 4, wherein the boron-phosphide-based semiconductor layer is formed at 750° C. to 1,200° C.

6. A method for producing a compound semiconductor device as described in claim 4, wherein the boron-phosphide-based semiconductor layer is formed at a growth rate of 2 nm/min to 30 nm/min.

7. A method for producing a compound semiconductor device as recited in claim 4, wherein the boron-phosphide-based semiconductor layer is formed at a growth rate of 20 nm/min to 30 nm/min in an initial stage of formation of the boron-phosphide-based semiconductor layer.

8. A diode comprising:
a boron-phosphide-based semiconductor layer, serving as a p-type layer or an n-type layer, formed on a {0001} crystal plane of a hexagonal silicon carbide crystal substrate, wherein
the boron-phosphide-based semiconductor layer is composed of a {111} crystal stacked on and parallel to the {0001} crystal plane of the silicon carbide crystal substrate, and
when the number of the layers contained in one periodical unit of an atomic arrangement in the [0001] crystal orientation of the silicon carbide crystal substrate is n, an n-layer-stacked structure included in the {111} crystal plane forming the {111} crystal has a stacking height virtually equal to the c-axis lattice constant of the silicon carbide crystal substrate, and
the {111} crystal forming the boron-phosphide-based semiconductor layer is stacked on the silicon carbide substrate in a line-symmetric manner with respect to the a-axis of the {0001} crystal plane of the silicon carbide crystal substrate.

* * * * *